(12) United States Patent
Kamel et al.

(10) Patent No.: US 9,052,216 B2
(45) Date of Patent: *Jun. 9, 2015

(54) UNIVERSAL INTERNET OF THINGS APPARATUS AND METHODS

(71) Applicant: eXcorda, LLC, Reno, NV (US)

(72) Inventors: Michel Roger Kamel, Buena Park, CA (US); Paul W. Donahue, Newport Coast, CA (US)

(73) Assignee: eXcorda, LLC, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/306,886

(22) Filed: Jun. 17, 2014

(65) Prior Publication Data

US 2014/0297210 A1 Oct. 2, 2014

Related U.S. Application Data

(63) Continuation of application No. 13/452,618, filed on Apr. 20, 2012.

(60) Provisional application No. 61/478,446, filed on Apr. 22, 2011, provisional application No. 61/483,552, filed on May 6, 2011.

(51) Int. Cl.
 *G06Q 50/06* (2012.01)
 *G01D 4/00* (2006.01)
 (Continued)

(52) U.S. Cl.
 CPC ............. *G01D 4/002* (2013.01); *H02J 13/0006* (2013.01); *H02J 13/0062* (2013.01);
 (Continued)

(58) Field of Classification Search
 CPC .... G06Q 50/06; G05B 15/02; G05B 19/4186;
 G05B 2219/2639; G06F 11/3062; G01D 4/002; G01D 4/004; F24F 2011/0075; F24F 2011/0071; F24F 2011/0047; F24F 11/0034; H02J 2003/143; H02J 13/0079; H04L 41/0213; H05K 7/1498
 USPC ......... 702/62, 57, 60–61, 64–67, 81, 84, 127, 702/182–183, 188–189; 340/540, 657, 340/870.01–870.03, 870.11; 700/286, 291; 705/412
 See application file for complete search history.

(56) References Cited

U.S. PATENT DOCUMENTS 7,346,463 B2   3/2008 Petite et al.
7,576,688 B2   8/2009 Lehtinen
(Continued)

FOREIGN PATENT DOCUMENTS

JP   2003-216715 A   7/2003
JP   2007-115041 A   5/2007
(Continued)

OTHER PUBLICATIONS

Padget et al., An Agent-Based Infrastructure for Energy Profile Capture and Management, Apr. 11-13, 2011, 2011 International Conference on Networking, Sensing and Control, Delft, the Netherlands, pp. 50-55.*

(Continued)

*Primary Examiner* — Toan Le
(74) *Attorney, Agent, or Firm* — Knobbe, Martens, Olson & Bear, LLP

(57) ABSTRACT

A system to aggregate, filter, and share data for analysis receives first data from a first sensor, system, or server where the first data has a first protocol. The system samples the first data at a first sampling rate to generate first digital data, where the first sampling rate is substantially continuous. Further, the system transmits at a reporting rate that is decoupled from the first second sampling rate at least the first digital data over a network having a third protocol that is different from the first protocol. The network can be accessed by wired or wireless access and includes one or more servers in cloud configuration.

18 Claims, 6 Drawing Sheets

(51) Int. Cl.
*G06Q 10/10* (2012.01)
*G08C 19/00* (2006.01)
*G01R 21/133* (2006.01)
*H02J 13/00* (2006.01)

(52) U.S. Cl.
CPC ............ *H02J 13/0079* (2013.01); *G06Q 10/10* (2013.01); *Y04S 10/18* (2013.01); *Y02E 60/724* (2013.01); *Y04S 40/124* (2013.01); *Y02E 60/7838* (2013.01); *G08C 19/00* (2013.01); *G01R 21/133* (2013.01); *Y04S 40/128* (2013.01); *Y02E 60/7869* (2013.01)

(56) References Cited

U.S. PATENT DOCUMENTS

| | | | |
|---|---|---|---|
| 7,587,481 | B1 | 9/2009 | Osburn, III |
| 8,063,775 | B2 | 11/2011 | Reed et al. |
| 8,190,381 | B2 | 5/2012 | Spanier et al. |
| 8,260,469 | B2 | 9/2012 | Gregory et al. |
| 8,666,685 | B2 | 3/2014 | Paik et al. |
| 8,666,688 | B2 | 3/2014 | Spanier et al. |
| 8,700,347 | B2 | 4/2014 | Spanier et al. |
| 2003/0187550 | A1 | 10/2003 | Wilson et al. |
| 2007/0246943 | A1 | 10/2007 | Chang et al. |
| 2009/0012654 | A1 | 1/2009 | Culp et al. |
| 2010/0023174 | A1 | 1/2010 | Nagata et al. |
| 2010/0138062 | A1 | 6/2010 | Zheng et al. |
| 2010/0324962 | A1 | 12/2010 | Nesler |
| 2011/0082598 | A1 | 4/2011 | Boretto et al. |
| 2011/0316559 | A1 | 12/2011 | Haffner et al. |
| 2012/0158198 | A1 | 6/2012 | Black et al. |
| 2012/0271576 | A1 | 10/2012 | Kamel et al. |
| 2012/0323382 | A1 | 12/2012 | Kamel et al. |
| 2013/0134962 | A1 | 5/2013 | Kamel et al. |
| 2014/0214220 | A1 | 7/2014 | Kamel et al. |
| 2014/0222231 | A1 | 8/2014 | Kamel et al. |
| 2014/0222232 | A1 | 8/2014 | Kamel et al. |
| 2014/0222486 | A1 | 8/2014 | Kamel et al. |
| 2014/0222665 | A1 | 8/2014 | Kamel et al. |
| 2014/0292533 | A1 | 10/2014 | Kamel et al. |
| 2014/0371935 | A1 | 12/2014 | Kamel et al. |
| 2014/0371936 | A1 | 12/2014 | Kamel et al. |
| 2014/0379156 | A1 | 12/2014 | Kamel et al. |

FOREIGN PATENT DOCUMENTS

| | | |
|---|---|---|
| JP | 2008-102708 A | 5/2008 |
| JP | 2008-102709 A | 5/2008 |
| JP | 2009-070339 A | 4/2009 |
| JP | 2010-237774 A | 10/2010 |
| KR | 10-2006-0119682 A | 11/2006 |
| WO | WO 2010/094621 | 8/2010 |
| WO | WO 2012/145715 | 10/2012 |
| WO | WO 2012/174348 | 12/2012 |
| WO | WO 2013/081978 | 6/2013 |

OTHER PUBLICATIONS

International Search Report and Written Opinion for PCT/US2012/042613, Feb. 27, 2013, 15 pages.
International Search Report and Written Opinion for PCT/US2012/066552, Mar. 25, 2013, 12 pages.
International Search Report and Written Opinion for PCT/US2012/034576, dated Nov. 14, 2012.
Office Action for U.S. Appl. No. 14/307,191 dated Sep. 5, 2014, 18 pages.
Search Report for European Application No. 12773510.8 dated Oct. 22, 2014, 9 pages.
Crawley et al., "Contrasting the Capabilities of Building Energy Performance Simulation Programs", Building and Environment, vol. 43, No. 4, Apr. 1, 2008, pp. 661-673.
O'Sullivan et al., "Improving Building Operation by Tracking Performance Metrics throughout the Building Lifecycle (BLC)", Energy and Buildings, Lausanne, CH, vol. 36, No. 11, Nov. 1, 2004, pp. 1075-1090.
Search Report for European Application No. 12800077.5 dated Feb. 6, 2015, 7 pages.
Office Action U.S. Appl. No. 14/307,191 dated Dec. 5, 2014, 13 pages.
Restriction Requirement for U.S. Appl. No. 13/452,618 dated Jan. 15, 2015, 7 pages.

* cited by examiner

UNIVERSAL INTERNET OF THINGS APPARATUS AND METHODS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application is a continuation of U.S. application Ser. No. 13/452,618, entitled "SYSTEMS AND METHODS FOR ANALYZING ENERGY USAGE", filed Apr. 20, 2012, and claims the benefit of priority under 35 U.S.C. §119(e) from U.S. Provisional Application No. 61/478,446, filed Apr. 22, 2011, entitled "SYSTEMS AND METHODS FOR UNIVERSAL ENERGY MEASUREMENT, ENERGY ANALYSIS, AND ENERGY COMMUNICATION," and from U.S. Provisional Application No. 61/483,552, filed May 6, 2011, entitled "SYSTEMS AND METHODS FOR ENERGY MEASUREMENT, ENERGY ANALYSIS, ENERGY DATA COMMUNICATION, AND ENERGY CONTROL," each of which is hereby incorporated herein by reference in its entirety to be considered a part of this specification. Any and all applications for which a foreign or domestic priority claim is identified in the Application Data Sheet as filed with the present application are hereby incorporated by reference under 37 CFR 1.57.

BACKGROUND

The alternating-current power grid developed in the late nineteenth century with features such as centralized unidirectional electric power transmission and demand-driven control. In the twentieth century, utilities inter-tied small local grids to form larger and larger power grids, which lent to efficiencies of scale. However, near the end of the twentieth century, the economies of scale of power production were limited by difficulties in propagating supply and demand price signals through the system, environmental concerns about power production, and an increased dependence on limited fossil fuel resources.

SUMMARY

Digital communications technology can be added to various tiers of the power grid to create smart grids at the utility level, the municipality level, the individual energy consumer level, and as far as the circuit, device or appliance level that are able to receive real-time energy data and react accordingly. Embodiments are directed towards an energy management system that measures, analyzes, communicates, and controls energy usage with two-way energy information. Embodiments collect and analyze energy data from electrical circuits and sensors, and communicate the energy information to power grids, micro grids, electric circuits, appliances, and devices for use by utilities, municipalities, businesses, and individual consumers.

Other embodiments of the energy management system perform real time continuous and automated digital measurement, analysis, and communication of energy usage. External sensors, such as temperature sensors, for example, provide additional energy-related data. The energy management system additionally stores and reports energy quality and metrics based on the analysis of the energy measurement data, external sensor data, and information from power utilities.

Further embodiments of the energy management system integrate at least some of universally interoperable "smart grid envisioned" digital energy measurement, energy use analysis, carbon footprint analysis, greenhouse gas emission analysis, energy quality and availability analysis, data correction algorithms, data reduction algorithms, data encryption algorithms, data storage, data communication, control of energy used, carbon footprints associated with the energy used, energy generated, and greenhouse gas emissions associated with the energy generated. Embodiments of the energy management system interface with "a smart device" "a smart appliance" "a smart building" "the smart grid", renewable energy generators, and the like.

Certain embodiments relate to a method of measuring and analyzing energy usage. The method comprises measuring one or more parameters indicative of energy usage for a plurality of sub-circuits, where the sampling rate for measuring is substantially continuous, automatically transmitting information related to at least one of the measured parameters at a reporting rate decoupled from the sampling rate that enables monitoring of current energy usage, detecting a significant change in a measured parameter, determining whether the significant change in the measured parameter is caused by a change in energy usage, and automatically transmitting, independent of the sampling rate and the reporting rate, information related to the significant change in the measured parameter caused by the change in energy usage after detecting the significant change.

According to a number of embodiments, the disclosure relates to a system for analyzing energy usage. The system comprises a plurality of energy measurement devices configured to measure one or more parameters indicative of energy usage for a plurality of sub-circuits, where the sampling rate for measuring is substantially continuous, computer hardware including at least one computer processor, and computer-readable storage including computer-readable instructions that, when executed by the computer processor, cause the computer hardware to perform operations defined by the computer-executable instructions. The computer-executable instructions include automatically transmitting information related to at least one of the measured parameters at a rate that enables monitoring of current energy usage, detecting a significant change in a measured parameter, determining whether the significant change in the measured parameter is caused by a change in energy usage, and automatically transmitting information related to the significant change in the measured parameter caused by the change in energy usage after detecting the significant change.

Further embodiments relate to a system for measuring, analyzing and controlling energy usage of a facility or facility subsystem. The system comprises a plurality of energy measurement devices configured to measure one or more parameters indicative of energy usage for a plurality of circuits, sub-circuits, or systems where a sampling rate for measuring is substantially continuous, a plurality of measurement devices configured to measure one or more parameters indicative of the energy efficiency of systems, where a sampling rate for measuring is substantially continuous, and a plurality of measurement devices configured to measure one or more parameters indicative of the environmental condition of systems and facilities, wherein a sampling rate for measuring is substantially continuous. The system further comprises computer hardware including at least one computer processor, and computer-readable storage including computer-readable instructions that, when executed by the computer processor, cause the computer hardware to perform operations defined by the computer-executable instructions. The computer-executable instructions include automatically transmitting information related to at least one of the measured parameters at a rate that enables monitoring of current energy efficiency, automatically obtaining relevant environmental conditions including weather data, automatically determining control sequence to maximize energy efficiency, automatically determining demand reduction potential, automatically determining control sequence to minimize demand usage at any time without affecting operations and comfort, automatically transmitting control commands to at least one system or equipment, detecting a significant change in a measured parameter, determining whether the significant change in the measured parameter is caused by a change in energy usage, determining whether and the significant change in the measured parameter caused a change in energy efficiency, and automatically transmitting information related to the significant change in the measured parameter caused by the change in energy efficiency after detecting the significant change.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
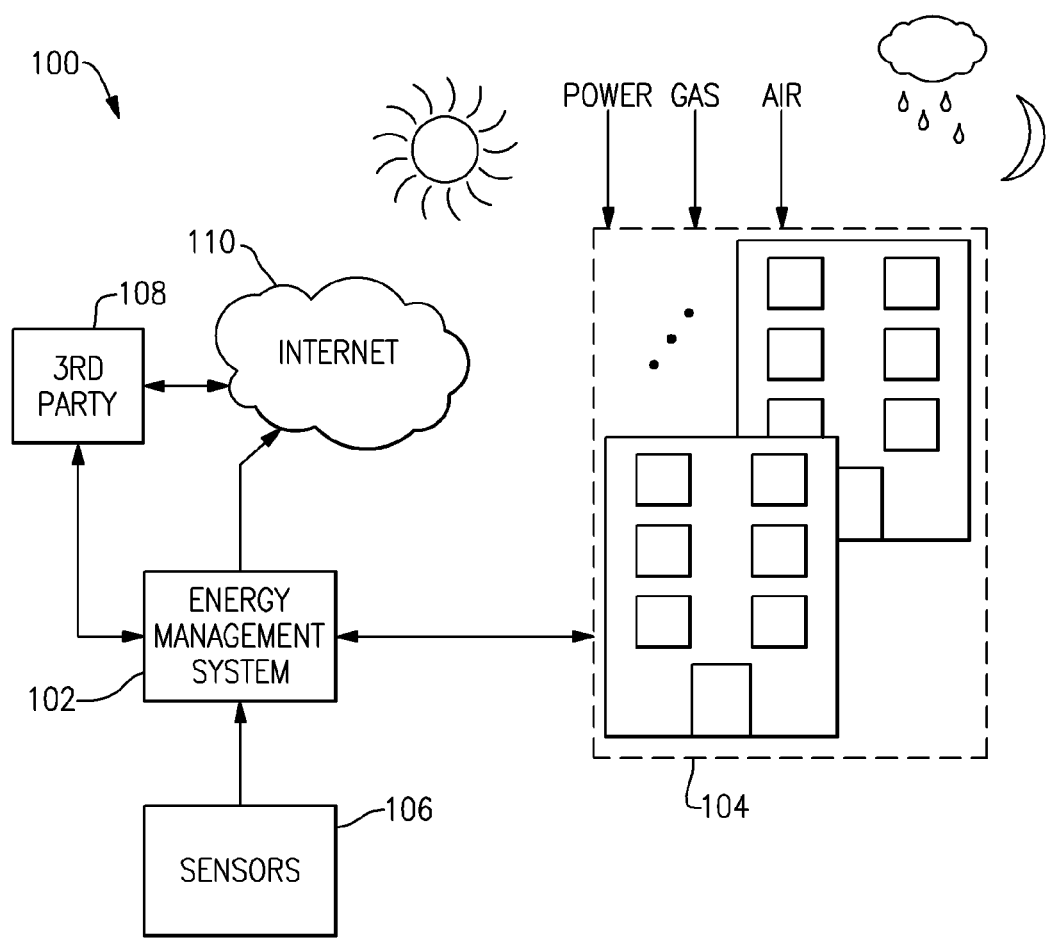
FIG. 1 illustrates a schematic diagram of energy usage including an energy management system to measure, analyze, communicate and control the energy usage, according to certain embodiments.

FIG. 1 illustrates a schematic diagram of energy usage 100 including an energy management system 102 to measure, analyze, communicate, and control the energy usage of a facility 104. Energy entering the facility 104 can be of many forms, such as for example, thermal, mechanical, electrical, chemical, light, and the like. The most common forms are typically electricity or power, gas, thermal mass (hot or cold air), and solar irradiance. The electrical energy can be generated from traditional fossil fuels, or alternate forms of power generation, such as solar cells, wind turbines, fuel cells, any type of electrical energy generator, and the like. Ambient weather conditions, such as cloudy days, or time of day, such as nighttime, may be responsible for radiant energy transfer (gains or losses). Facilities 104 can comprise one or more buildings, residences, factories, stores, commercial facilities, industrial facilities, one or more rooms, one or more offices, one or more zoned areas in a facility, one or more floors in a building, parking structures, stadiums, theatres, individual equipment or machinery (motors, chillers, pumps, fans, elevators, etc.), electric vehicles with energy and/or information flow, or the like. In another embodiment, the energy management system 102 measures, analyzes, communicates, and controls the energy usage of one or more electric circuits, appliances, devices, micro grids, power grids, or the like associated with the facility 104.

The energy management system 102 measures energy parameters from the energy entering and consumed in the facility 104. The energy management system 102 additionally receives sensor signals from sensors 106. The sensors 106 can comprise current sensors, voltage sensors, EMF sensors, touch sensors, contact closures, capacitive sensors, trip sensors, mechanical switches, torque sensors, temperature sensors, air flow sensors, gas flow sensors, water flow sensors, water sensors, accelerometers, vibration sensors, GPS, wind sensors, sun sensors, pressure sensors, light sensors, tensionmeters, microphones, humidity sensors, occupancy sensors, motion sensors, laser sensors, gas sensors ($CO_2$, $CO$), speed sensors (rotational, angular), pulse counters, and the like.

The energy management system communicates with third parties 108 directly, over local area networks, over the world wide web 110, such as the Internet, over a smart grid, and the like. Third parties are, for example, utility companies, building maintenance personnel, other energy management systems, first responders, emergency personnel, governmental energy agencies, equipment, control systems, other facilities, information databases, software systems, web services, equipment vendors, equipment technical support personnel, administrators, managers, smart meters, circuit breakers, machinery, equipment, vehicles, battery systems, power generators, fuel cells, inverters, PV panels, RSS Feeds, weather stations, measurement devices with digital output, and the like. The energy management system 102 transmits the measured energy parameters, energy performance metrics, energy reports, energy alerts, control commands, activity logs, electricity demand reduction potential, demand reduction potential (electricity, gas, water), demand reduction measurements (electricity, gas, water), baseline energy information, peak energy information, energy duty cycle, power quality information, the sensor signals, and the like, to the third party 108. In addition, the energy management system 102 can receive additional energy data from the third party 108. Examples of the additional data include environmental data, weather forecast, fuel type, energy rates, grid loading, prior energy consumption, facility occupancy schedules, BIM (Building Information Modeling) data, GIS (Geographic Information System) data, facility data, equipment specification data, equipment maintenance logs, asset inventory data, and the like.

The energy management system 102 analyzes the measured energy parameters, the sensor signals, and the additional data to provide analyzed energy data and energy controls. The energy management system 102 analyzes the data to calculate energy loads, determine possible energy reductions, identify malfunctioning systems, determine carbon footprints, calculate phase imbalance, calculate power quality, calculate power capacity, calculate energy efficiency metrics, calculate equipment duty cycles, calculate energy load profiles, identify peak energy, determine wasted energy, analyze root cause of wasted energy, identify losses due to simultaneous heating and cooling, calculate overcooling, calculate overheating, calculate schedule losses, calculate rate analysis, calculate payback of energy improvement measures, calculate optimum capacity and maximum payback of alternate energy sources, calculate demand reduction potential, calculate energy forecast, and the like. In an embodiment, energy management system 102 provides energy control signals based at least in part on the analysis of the measured energy parameters, the sensor signals, and the additional third party data. In one embodiment, the energy control signals are pulse width modulation (PWM) control signals to control the loading of electrical circuits associated with to the facility 104. Other examples of energy control signals are, but not limited to, relay interrupts, software interrupts, analogue outputs, digital outputs, frequency modulation, voltage modulation, current clamping, wireless control (AM, FM, RF, Wi-Fi™, WiMax™, etc.), wired control (Ethernet®, BACNET®, ModBus®, IonWorks™, etc.) and the like. In other embodiments, the energy management system 102 transmits the analyzed energy data to the third parties 108 through direct communications, over a local area network, over the Internet, over a smart grid, and the like.

Figure 2:
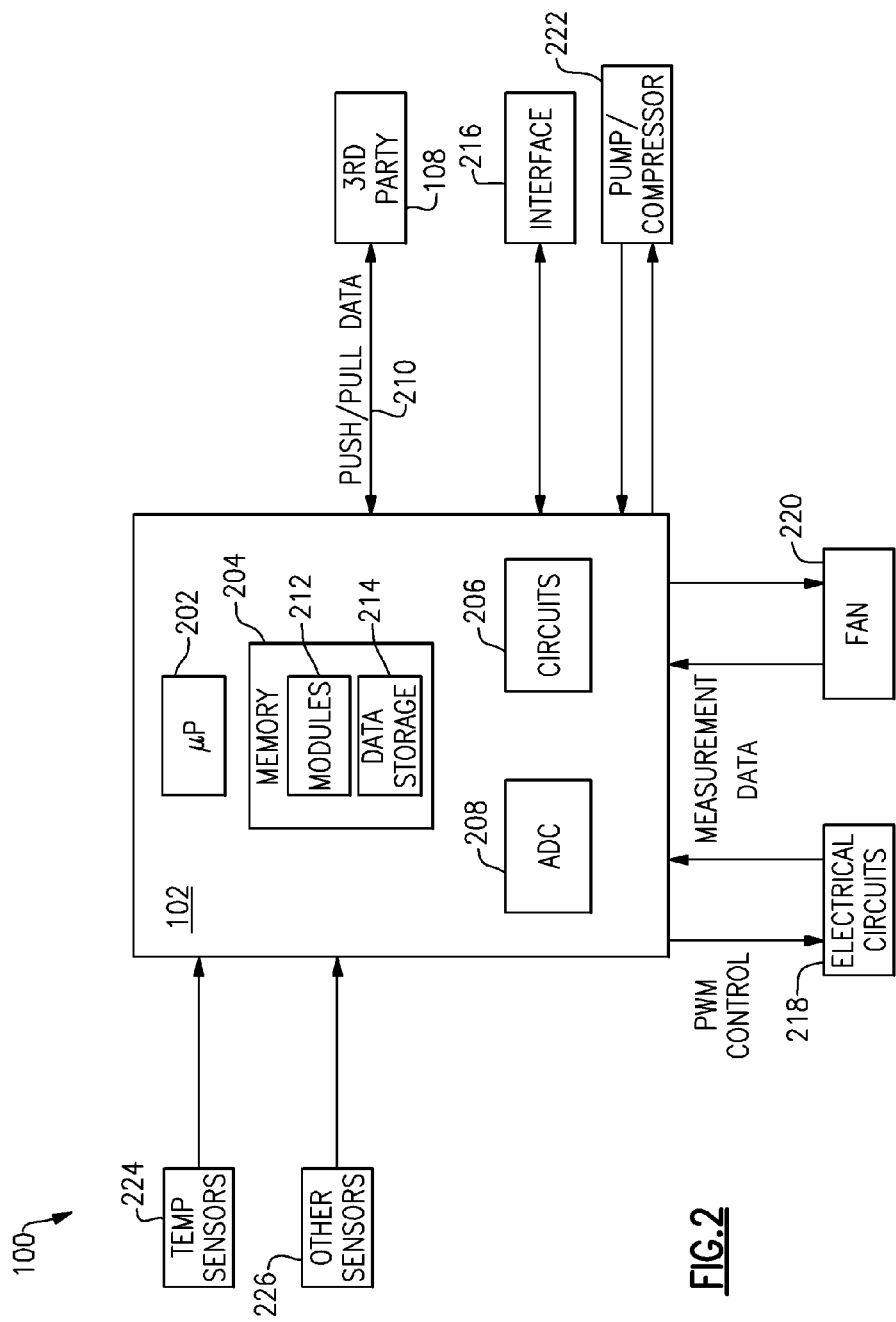
FIG. 2 illustrates an exemplary schematic diagram of an energy management system, according to certain embodiments.

FIG. 2 illustrates an exemplary block diagram of an embodiment of the energy management system 102. The energy management system 102 comprises one or more computers 202 and memory 204, and communicates with one or more third parties 108 through a network 210.

The computers 202 comprise, by way of example, processors, Field Programmable Gate Array (FPGA), System on a Chip (SOC), program logic, or other substrate configurations representing data and instructions, which operate as described herein. In other embodiments, the processors can comprise controller circuitry, processor circuitry, processors, general-purpose single-chip or multi-chip microprocessors, digital signal processors, embedded microprocessors, microcontrollers and the like. In an embodiment, the processor is an ADE 7880 by Analog Devices, an ADE 5169 by Analog Devices, or ADE 7953 by Analog Devices, and the like.

The memory 204 can comprise one or more logical and/or physical data storage systems for storing data and applications used by the processor 202. In an embodiment, the memory 204 comprises program modules 212 and at least one data storage module 214. In an embodiment, the data storage module includes at least one database.

In certain embodiments, the network 210 can comprise a local area network (LAN). In yet other embodiments, the network 210 can comprise one or more of the following communication means: internet, Internet, intranet, wide area network (WAN), home area network (HAN), public network, smart grid, combinations of the same, or the like. In other embodiments, the network 210 can be any communication system including by way of example, telephone networks, wireless data transmission systems, two-way cable systems, customized computer networks, interactive television networks, and the like. In addition, connectivity to the network 210 may be through, for example, TCP IP, Ethernet®, Zig-Bee®, BlueTooth®, Power Line Carrier (PLC), WiFi™, WiMax™, ModBus®, BACnet®, GSM® (Global System for Mobile Communication), GPRS (General Packet Radio Service), combinations of the same, or the like.

In an embodiment, the memory 204 comprises an interface module, such as a Graphic User Interface (GUI), or the like, to provide a user interface to the energy management system 102 through interface equipment 216. The interface equipment comprises, by way of example, a personal computer, a display, a keyboard, a QWERTY keyboard, 8, 16, or more segment LEDs, LCD panels, a display, a smartphone, a mobile communication device, a microphone, a keypad, a speaker, a pointing device, user interface control elements, combinations of the same, and any other devices or systems that allow a user to provide input commands and receive outputs from the energy management system 102.

The energy management system 102 further comprises input/output circuits 206 and analog to digital converter (ADCs) modules 208. The input/output circuits 206 interface with electrical circuits 218, including motors, such as, for example, fans 220, pumps/compressors 222, variable air volume (VAV) valves, elevators, and the like, temperature sensors 224, light ballasts, light switches, and other internal or external sensors 226 to provide current or voltage matching, voltage or current level adjustment, control signals, frequency adjustment, phase adjustment, or the like. The input/output circuits 206, in an embodiment, scale the electrical measurements and sensor data so that the energy measurement and sensor data can be analyzed and stored by the processor 202 and the memory 204. The input/output circuits 206 are digital, analog, or combinations of analog and digital circuits.

The ADC modules 208 interface with the electrical circuits 218, 220, 222, to convert the analog energy measurements to digital values for further analysis and processing by the processor 202 and memory 204.

Figure 3:
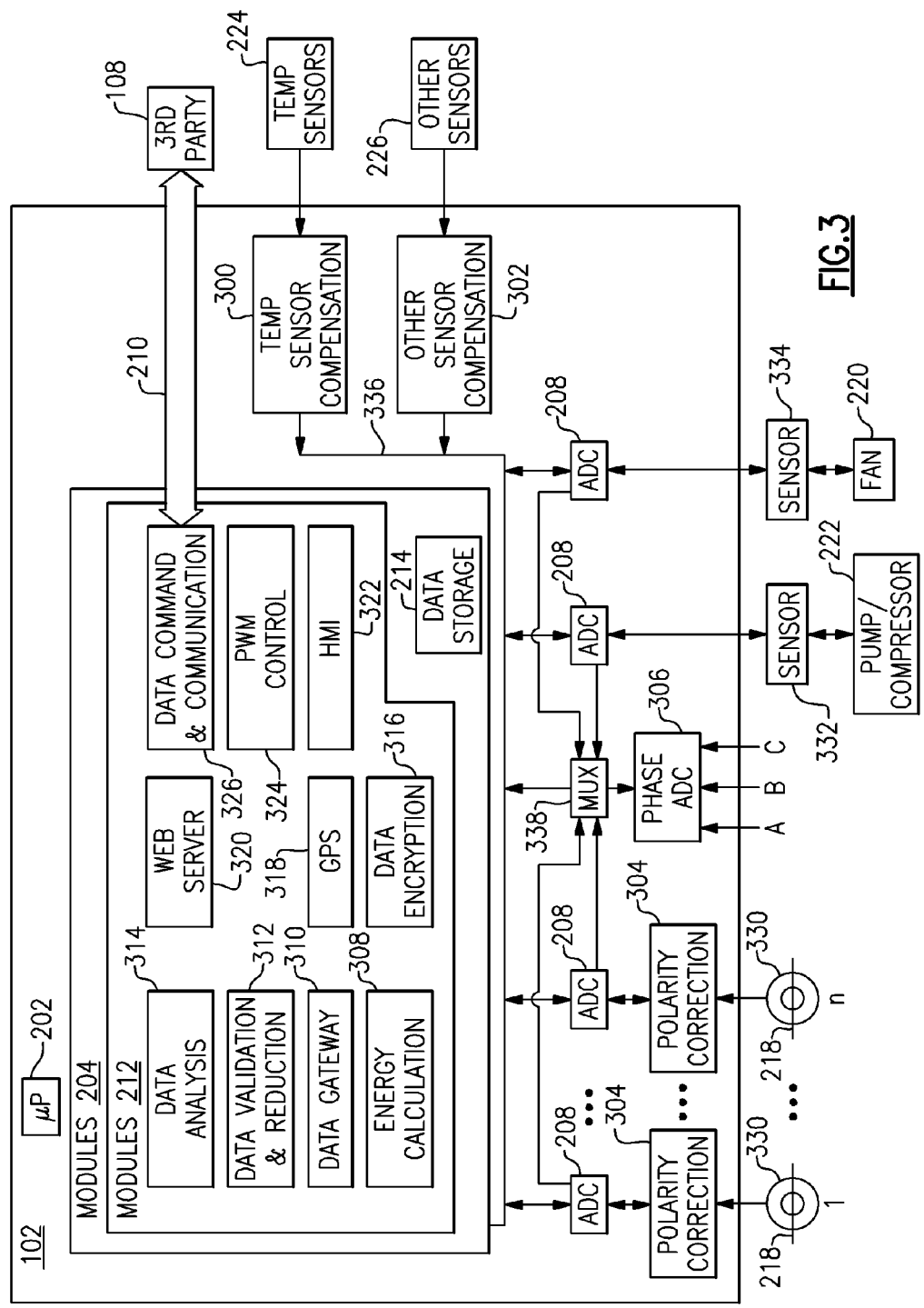
FIG. 3 illustrates a schematic diagram of the exemplary energy management system of FIG. 2, according to certain embodiments

FIG. 3 illustrates an embodiment of the energy management system 102 comprising the processor 202, memory 204, one or more temperature sensor compensation module 300, one or more sensor compensation modules 304 for other sensors, one or more ADC modules 208, one or more polarity correction devices 304, one or more multiplexing devices 338, and one or more phase ADC modules 306. The memory 204 comprises the data storage module 214 and the program modules 212. In an embodiment, the program modules 212 comprise an energy calculation module 308, a data gateway module 310, a data validation and reduction module 312, a data analysis module 314, a data encryption module 316, a global positioning system (GPS) module 318, a web server module 320, a human machine interface module 322, a pulse width modulation (PWM) controller module 324, and a communication module 326.

In an embodiment, the energy measurement system 102 measures electrical parameters, such as voltage, current, line-to-line voltage, line-to-line current, line to neutral voltage, line to neutral current, total power, reactive power, active power, fundamental and harmonic total energy per phase, fundamental and harmonic reactive energy per phase, active energy per harmonic frequency per phase, reactive energy per harmonic frequency per phase, fundamental and harmonic active energy per phase, and the like, of 1 to n electrical circuits or sub-circuits 218. In addition, the measured parameter comprises, by way of example, light intensity, rotational speed, linear speed, temperature, vibration, carbon dioxide, pressure, motion, flow, acceleration, voltage, current, sound, ultrasonic frequencies, and the like. The electrical circuit 218 can be locally or remotely located from the energy management system 102 and can measure voltages ranging from 0 volts in a de-energized state to up to approximately 600 VAC or VDC in an energized state, and high speed voltage spikes to 4 KV. The energy management system 102 measures electrical circuits 218 have various phase configurations, such as, for example, single phase, split phase, three phase Delta, three phase Wye, and the like. The energy management system 102 operates at voltages from 80 VAC to 600 VAC and multiple frequencies, such as, for example, 50 Hz, 60 Hz, and the like.

A measurement device 330 is associated with each electrical circuit 218 and acquires an analog measurement of the current, voltage, or power in its associated electrical circuit 218. In an embodiment, the measurement devices 330 couple directly into the facility's power distribution system where electrical measurements can be acquired internally from the main power distribution bars or through a connection to a circuit breaker. In another embodiment, measurement devices 330 can be embedded in the circuit breakers to measure the voltage and current of the circuit 218 associated with the circuit breaker.

In an embodiment, the measurement device 330 electrically couples to the energy management system 102 by directly connecting the output leads of the measurement device 330 to the energy management system 102. In another embodiment, the measurement devices 330 communicate measured energy data from the circuit 218 to the energy management system 102 and control signals from the energy management system 102 to the circuit 218 via wireless, wired, optical, or power line carrier (PLC) communications.

The measurement devices 330 can be powered from the pickup and rectification of the electromagnetic fields associated with the circuit 218, by an electrical connection to energized circuits with or without re-chargeable battery backup, or the like. The measurement devices 330 comprise, by way of example, Rogowski coils, DC shunts, external digital current sensors, external analog current sensors, clamp on current measuring toroid transformers (CTs), shunt resistor modules in series with a circuit breaker, combinations of the same, and the like.

In an embodiment, the measurement devices 330 comprise current transformers 330. When the current in a circuit 218 is too high to directly apply to measuring instruments, the current transformer 330 produces a reduced current approximately proportional to the current in the circuit 218. The current transformer 330 also isolates the measuring instrument from very high voltage that could damage the measuring instrument if directly connected to the circuit 218.

For each measured electrical circuit 218, the current transformer 330 electrically couples to the ADC module 208 through the polarity correction device 304. The polarity correction device 304 provides the correct polarity of the circuit 218 to the ADC 208 should the current transformer 330 be installed incorrectly. For example, when the current transformer 330 is installed incorrectly, such as by reversing the +/− outputs of the current transformer 330 with respect to the circuit 218 it is measuring, the phase of the measurement can be approximately 180 degrees different from the actual phase of the measured circuit 218.

Figure 4:
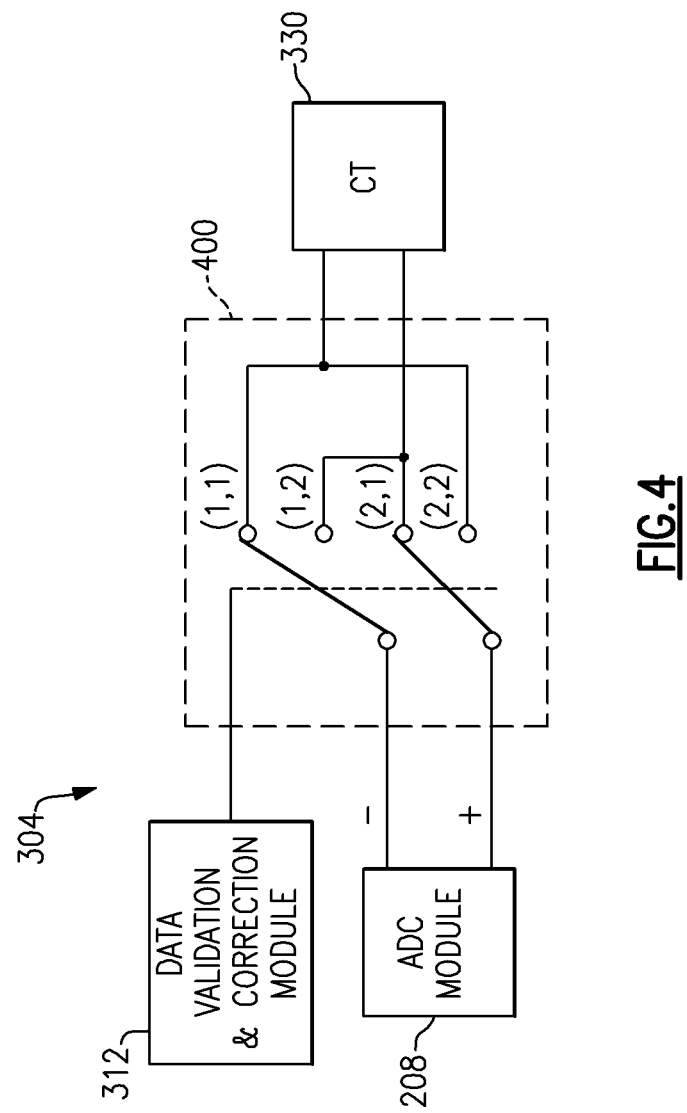
FIG. 4 is a schematic diagram showing a polarity correction device, according to certain embodiments.

FIG. 4 is a schematic diagram illustrating an embodiment of the polarity correction device 304. As describe above, the current transformer 330 electrically couples to the ADC module 208 through the polarity correction device 304, for each circuit 208. The energy management system 102 automatically corrects for the polarity of the measured circuit 218 should the current transformer 330 be installed incorrectly by sending a control signal to the polarity correction device 304. Polarity correction can also be done via software in one or more of the energy calculation module 308, the data gateway module 310 or the data validation and reduction module 312.

In the embodiment illustrated in FIG. 4, the polarity correction device 304 comprises a latching double pole double throw switch 400. The switch 400 is wire for polarity-reversal by connecting the second throw of the first switch (1, 2) to the first throw of the second switch (2,1) and also by connecting the first throw of the first switch (1,1) to the second throw of the second switch (2,2). The switch 400 can be a hardware device which may be internally wired for polarity-reversal applications or implemented in the modules 212.

The energy management system 102 automatically corrects the polarity of the measured circuit 218 by controlling the position of the switch 400. In an embodiment, the data validation and reduction module 312 evaluates when the voltage phase from the phase ADC module 306 and the current phase from the ADC module 208 for a given measured circuit 218 are separated by more than approximately 90 degrees and less than approximately 270 degrees, and/or when the measured energy is negative in the absence of power generation. When this condition exists, the current transformer 330 is incorrectly coupled to the circuit 218 and is measuring an incorrect phase of the circuit 218. The data validation and reduction module 312 transmits a control signal to the switch 400 or applies a software correction. The switch 400 receives the control signal and switches the contacts to the alternate position, thereby correcting the measured polarity.

Referring to FIG. 3, the output of the polarity correction device 304 comprises the measured signal from the measurement device 330 with the correct polarity. The output of the polarity correction module 304 electrically couples to the input of the ADC module 208. The electrical signals from the electrical circuits 218 are analog signals that are continuous in time. The ADC module 208 samples the analog electrical signal from the measurement device 330 at a sampling rate and converts the analog measurements to digital values for use by the processor 202 and program modules 212.

In an embodiment, the energy management system 102 measures and analyzes energy data from the electrical circuit 222 comprising an electric motor that is used for pumping water or fluids, or for compressing a gas such as used for compressed air, compressed oxygen, compressed nitrogen, a heating, ventilation, and air conditioning (HVAC) system, or the like. Sensors 332 physically attach or electrically couple to the motor/pump/compressor 222. Examples of the sensors 332 are, but not limited to, an accelerometer for measuring vibration, a thermocouple for measuring temperature, the current transformer 330 and polarity correction device 304 for measuring current and voltage that is supplied to the motor 222 in 1 to n stages, and the like. Additionally, the fluid flow rate of the motor/pump 222 or the gas pressure in the motor/compressor 222 can be measured through direct flow measurement, with an ultrasonic flow sensor, with a pressure gauge, or the like. The output of the sensor 332 electrically couples to the input of the ADC module 208. The ADC module 208 samples the analog electrical signal from the sensors 332 at a sampling rate and converts the analog measurements to digital values for use by the processor 202 and the program modules 212.

In another embodiment, the energy management system 102 measures and analyzes energy data from an electrical circuit 220 comprising an electric motor that is connected to a fan to deliver air flow. Sensors 334 physically attach or electrically couple to the motor/fan 220. Examples of the sensors 334 are, but not limited to, an accelerometer for measuring vibration, a thermocouple for measuring temperature, the current transformer 330 and polarity correction device 304 for measuring current and voltage that is supplied to the motor/fan 220 in 1 to n stages, air flow sensors to measure air flow from the motor/fan 220, and the like. The output of the sensor 334 electrically couples to the input of the ADC module 208. The ADC module 208 samples the analog electrical signal from the sensors 334 at a sampling rate and converts the analog measurements to digital values for use by the processor 202 and the program modules 212.

In an embodiment, the ADC module 208 comprises an analog to digital converter, such as, for example ADE 5169 by Analog Devices, or the like, and at least one jumper. The jumper is field selectable to measure the phase of the electric circuit 218 having one of various possible phase configurations, such as single phase, split phase, three-phase Delta, three-phase Wye, or the like. In another embodiment, the ADC module 208 comprises an ADC, such as ADE 5169 by Analog Devices, for example, and the phase configuration and association of the ADC module 208 with its respective phase voltage can be performed by the program modules 212. Further, the data sampling rate of the ADC module 208 can range from approximately 10 Hz to approximately 1 MHz. In one embodiment, more than one set of phase voltages can be connected to the energy management system 102, such as voltage upstream and downstream of a transformer. The phase configuration of the ADC module 208 can be referenced to any of the voltage phases through modules 212.

In another embodiment, a high speed ADC module 208 is electrically coupled in parallel to a low speed ADC module 208 included in an ADE7880 by Analog Devices. The high speed ADC module 208 measures high speed voltage transients while the ADE7880 ADC and microprocessor measure the active and reactive energy parameters.

The phase ADC module 306 electrically couples to electrical circuits having phases A, B, C through resistive voltage dividers (not shown) or step down transformers (not shown) to digitally measure the voltage amplitude and phase information for the phases A, B, C. The resistive dividers proportionally reduce the amplitude of the electrical signal such that the signal level is compatible with the input signal requirements of the phase ADC module 306.

The phase signals from the phases A, B, C are analog signals that are continuous in time. The energy management system 102 is capable of measuring three-phase, 3-wire Delta electrical connections and measuring three-phase, 4-wire Wye electrical connections. For example, a three-phase Delta power generation system transmits power on a 3-wire system where the phase of the power on each wire is separated in phase from the other wires by approximately 120 degrees. The energy management system 102 chooses one of the phases as a reference point. In another example, a three-phase Wye power generation system transmits power on a 4-wire system where three of the wires carry electrical current with phases separated by approximately 120 degrees from each other. The fourth wire is neutral, which is the reference point. The phase ADC module 306 samples these analog electrical signals at a sampling rate and converts the analog measurements to digital values for use by the processor 202 and modules 212. Each ADC module 306 can be referenced to any of the voltage phase by software selection and use of modules 212. In an embodiment, voltage phases are measured once in module 306.

In one embodiment, a high speed phase ADC module 306 is electrically coupled in parallel to a low speed phase ADC module 306 included in an ADE7880 by Analog Devices. The high speed phase ADC module 306 measures high speed voltage transients while the ADE7880 ADC and microprocessor measure the active and reactive energy parameters.

In an embodiment, the energy management system 102 can be used to measure currents and voltages of circuits on two or more three-phase voltage sources. The three-phase voltage sources are connected to two or more phase ADC modules 306. The multiplexing device 338 is used to reference each line voltage in the phase ADC modules 306 to any other line voltage in any of the phase ADC modules 306. The multiplexing device 338 is also used to reference the phase angle of the current in any of the ADC modules 208 to the phase angle in any of the line voltages in any of the phase ADC module 306.

In another embodiment, the energy management system 102 can be used to measure currents and voltages of circuits on two or more three-phase voltage sources. The three-phase voltage sources are connected to two or more phase ADC modules 306. The multiplexing device 338 is used to reference each line voltage in the phase ADC modules 306 to any other line voltage in any of the phase ADC modules 306. The multiplexing device 338 is also used to reference the phase angle of the current in any of the ADC modules 208 to the phase angle in any of the line voltages in any of the phase ADC modules 306.

In yet another embodiment, the multiplexing function of the multiplexing device 338 occurs by software. The digitized voltage and current waveforms are digitally multiplexed in real time using an FPGA or a digital signal processor. The digital multiplexer is used to reference the phase angle of any of the current ADC modules 208 to the phase angle of any of the voltage phase ADC modules 306.

In an embodiment, the phase ADC module 306 comprises an analog to digital converter, such as, for example, ADE 5169 by Analog Devices, or the like, and at least one jumper. The jumper is field selectable to measure the phase A, B, C having one of various possible phase configurations, such as single phase, split phase, three-phase Delta, three-phase Wye, or the like. Further, the data sampling rate of the phase ADC module 306 can range from approximately 0.1 Hz to approximately 1 MHz.

In an embodiment, the energy management system 102 and its sub-modules can be powered externally or internally through the voltage connection in phase ADC module 306. In other embodiments, external power can be from another energy management system 102, an external AC/DC power supply, an external AC power, or the like.

The phase ADC module 306, the ADC modules 208 for the electrical circuits 218, 220, 222 couple to the memory 204 over a system bus 336. The system bus 336 can include physical and logical connections to couple the processor 202, the memory 204, the sensor compensation 300, 302, and the ADC modules 208, 306 together and enable their interoperability.

The digital measurement information collected by the phase ADC module 306, the ADC modules 208 for the 1 to n electrical circuits 218, and the ADC modules 208 for the circuits 220, 222 is sent to the energy calculation module 308. The energy calculation module 308 performs energy calculations on the digital measurement information and provides calculated energy data. Examples of the calculated energy data are, but not limited to, line-to-line and line-to-current voltage, total power, active power, reactive power, line-to-line and line-to-neutral current, power factor, fundamental and harmonic total energy per phase, fundamental and harmonic total energy for the sum of phases, fundamental and harmonic active energy per phase, fundamental and harmonic active energy for the sum of phases, fundamental and harmonic reactive energy per phase, fundamental and harmonic reactive energy for the sum of phases, frequency, harmonic frequency, gas usage, chilled water usage, hot water usage, total energy usage, and the like.

The data gateway module 310 samples the measured energy data and the calculated energy data by controlling the sampling rate of the phase ADC module 306 and the ADC modules 208. The sampling rate ranges from approximately 0.1 Hz to approximately 1 MHz, and is preferably between approximately 1 KHz and approximately 20 KHz, more preferably between approximately 5 KHz and approximately 18

KHz, and most preferably between approximately 1 KHz and approximately 8 KHz. In another embodiment, the sampling rate ranges from approximately 0.1 Hz to approximately 24 KHz, and is preferably between approximately 1 KHz and approximately 10 KHz, more preferably between approximately 10 KHz and approximately 15 KHz, and most preferably between approximately 10 KHz and approximately 24 KHz. In an embodiment, the sampling rate is user selectable by the user from the user interface equipment 216. The data gateway module 310 sends the measured data and the calculated energy data to the data validation and reduction module 312. In another embodiment, the ADC sampling rate is decoupled from the data reporting rate sent to the $3^{rd}$ party. The ADC sampling rate ranges from 10 kHz to 1 MHz. The data reporting (push) rate to the $3^{rd}$ party can be user selectable and can be specific to data from each of the sensors 330, 332, 334, 226, 224.

The data validation and reduction module 312 receives the measured data and the calculated energy data from the data gateway module 310. Further, the data validation and reduction module 312 compares the measured data and the calculated energy data with prior data samples and/or near-in-time data samples to insure that relevant and accurate data is passed to the data storage module 214 and to the data command and communication module 326. In an embodiment, the data validation and reduction module 312 determines data accuracy.

In another embodiment, the data validation and reduction module 312 reduces the quantity of measured energy data. This is important for embodiments where multiple energy management systems 102 are each acquiring measurement data at up to approximately 24 KHz from multiple circuits 218, 220, 222 because data collection could overload a network, such as the smart-grid, or even the communication network 210, with data. In a further embodiment, the data validation and reduction module 312 performs both data reduction and correction.

In one embodiment, the data validation and reduction module 312 analyzes significant changes in a measured energy parameter. In an embodiment, the significant change in the measured energy parameter may be indicative of a change in energy usage, or may be corrupted data. The data validation and reduction module 312 analyzes energy spikes in the measured energy data to determine whether the spike is a valid change in energy usage, noise, or corrupted data by acquiring additional samples from the data gateway module 310 at approximately the same time or near-in-time as the energy spike. If the energy spike is a valid data measurement, the amplitude of the later acquired sample will be proportional to the energy spike. If the amplitude of the later acquired data is substantially different than the energy spike, the data validation and reduction module 312 determines that the energy spike was caused by noise, and treats the bad data as irrelevant and not worthy of being passed on for storage or "push" or "pull" communication.

In an embodiment, if the significant change is relevant and indicative of a change in energy usage, the energy management system 102 automatically transmits or pushes information relating to the significant change in the measured parameter within one hour after the detected change occurs, preferably within 15 minutes after the detected change occurs, more preferable within 1 minute after the detected change occurs, and most preferably within one second after the detected change occurs.

In one embodiment, the data validation and reduction module 312 reduces the quantity of measured energy data that will be reported in substantially real time, stored in the data storage module 214, pushed or automatically transmitted to a remote or cloud database over the communication network 210, or pulled from a user inquiry. The reduced quantity of energy data is based at least in part on previously defined or user defined data filtering parameters, such as, for example, the amount of change of measured or calculated energy data, the rate of change of measured or calculated energy data, a maximum threshold on any of the measured or analyzed data, a minimum threshold on any of the measured or analyzed data, or the like. Reducing the quantity of measured data enables the energy measurement system 102 to use low, medium, or high speed data communication channels over the network 210 to deliver real time or near real time energy reporting for circuits 218, 220, 222 that are being digitally sampled at a higher rate.

In an embodiment, the data filtering parameter is at least a 10% change in the detected value of the parameter, where the change is one of an increase or a decrease, where the parameter is a measured or a calculated parameter, and where the change is between the current value and the previous value of the parameter. More preferably, the data filtering parameter is at least a 5% change, and most preferably, the data filtering parameter is at least a 1% change. In another embodiment, the data filtering parameter is at least a 10% change in the detected parameter.

In another embodiment, the data filtering parameter is at least a 10% difference in the rate of change of a parameter, where the change is one of an increase or a decrease, where the parameter is a measured or a calculated parameter, and where the change is between the detected current rate of change and the previous rate of change of the parameter. More preferably, the data filtering parameter is at least a 5% difference in the rate of change, and most preferably, the data filtering parameter is at least a 1% difference in the rate of change.

Figure 5:
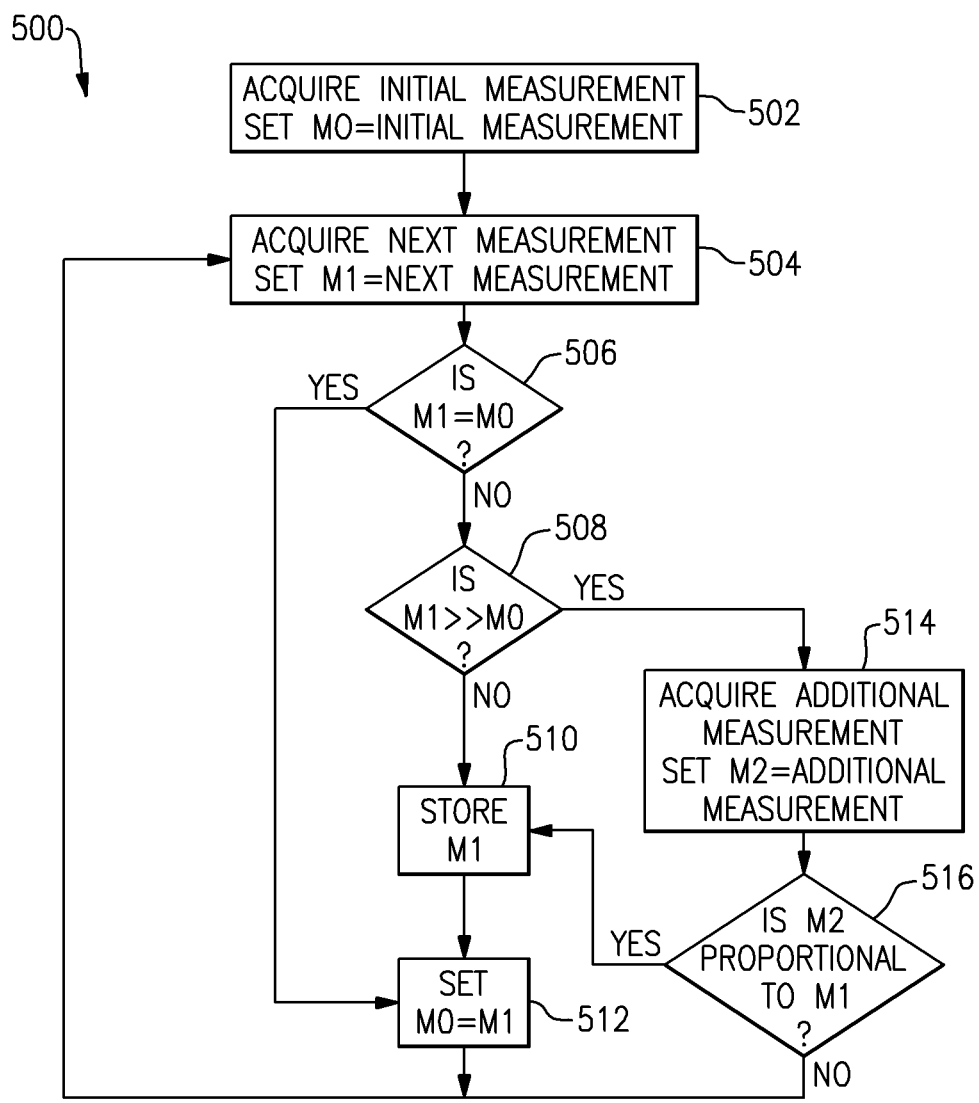
FIG. 5 is a flow chart of an exemplary data reduction and data validation process, according to certain embodiments.

FIG. 5 is a flow chart of an exemplary data reduction and data validation process 500 for the data validation and reduction module 312. In an embodiment, the process 500 reduces and validates the data measured and/or calculated from at least one of the electrical circuits 208, 220, 222. Beginning at block 502, the process 500 acquires an initial energy measurement $M_0$ from the data gateway module 310. At block 504, the process 500 acquires a next energy measurement $M_1$ from the data gateway module 310. $M_0$ and $M_1$ are measurements of the same electrical parameter but separated in time, with $M_0$ occurring first in time. In an embodiment, $M_0$ and $M_1$ are separated in time by one or more time periods of the sampling rate of the ADC module 208.

At block 506, the process compares $M_0$ and $M_1$ and determines whether $M_0$ and $M_1$ have approximately the same value. In an embodiment, $M_0$ and $M_1$ are approximately equal if $M_0$ and $M_1$ differ from each other no more than a percentage of their value, which is user-determined. For example, $M_0$ and $M_1$ could be considered to have approximately the same value if they differ from each other by no more than 1%. In another embodiment, $M_0$ and $M_1$ have approximately the same value when $M_0 = M_1$.

If $M_0$ and $M_1$ are approximately the same value, the process 500 determines $M_1$ is redundant data or data with little value and sets $M_0$ to $M_1$ at block 512 without storing $M_1$. From block 512, the process 500 returns to block 504 and acquires the next measurement $M_1$.

If $M_0$ and $M_1$ are not approximately the same value at block 506, the process 500 moves to block 508 where the process 500 determines whether the values of $M_0$ and $M_1$ differ significantly, as could be indicative of an energy spike in the measured parameter 218, 220, 222. In an embodiment, $M_0$ and $M_1$ differ significantly if $M_0$ and $M_1$ differ from each other more than approximately a percentage of their value, which is user-determined. For example, $M_0$ and $M_1$ could be considered to differ significantly if they differ from each other by more than 50%.

If $M_0$ and $M_1$ do not differ significantly, the process determines that $M_1$ is a valid data measurement and is not a redundant data measurement and stores $M_1$ in the data storage module 214. At block 512, the process 500 sets $M_0$ to $M_1$ and returns to block 504, where it acquires the next measurement $M_1$.

If $M_0$ and $M_1$ differ significantly at block 508, the process 500 moves to block 514 where at least one additional measurement $M_2$ is acquired. In an embodiment, the at least one additional measurement $M_2$ is acquired within 5 minutes of detecting the significant change in the measured parameter, more preferably within 1 minute, and most preferably within 10 msec.

At block 516, the process 500 determines whether $M_2$ is proportional to $M_1$. $M_2$ and $M_1$ are measurements of the same electrical parameter but separated in time with $M_1$ occurring first in time. In an embodiment, $M_2$ and $M_1$ are separated in time by one or more time periods of the sampling rate of the ADC 208. In another embodiment, $M_2$ is acquired asynchronously with respect to $M_1$. If the energy spike $M_1$ is a valid data measurement, the amplitude of the later acquired sample, $M_2$, will be approximately proportional to the amplitude of the energy spike $M_1$. In an embodiment, $M_2$ is approximately proportional to $M_1$ if the ratio $M_2/M_1$ is approximately constant.

If $M_2$ is approximately proportional to $M_1$, then $M_1$ is a valid data measurement and the process 500 moves to block 510. At block 510, the process 500 stores $M_1$ in the data storage module 214. At block 512, the process 500 sets $M_0$ to $M_1$ and returns to block 504, where it acquires the next measurement $M_1$.

If $M_2$ and $M_1$ are not approximately proportional, $M_1$ is most likely not a valid data measurement. The process 500 determines that the energy spike $M_1$ was caused by noise and treats the bad data as irrelevant and not worthy of being passed on to the data storage module 214 or for push/pull communication. The process returns to block 504 and acquires the next measurement $M_1$. Thus, the process 500 validates and reduces the measured and calculated energy data.

Referring to FIG. 3, the data validation and reduction module 312 sends the validated and reduced energy data to the data analysis module 314. The data analysis module 314 also receives and processes data from $3^{rd}$ party through data command and communication module 326, and from data storage module 214. The data analysis module 314 sends the validated and reduced energy data, and/or results of energy analysis, efficiency analysis, usage analysis, occupancy analysis, performance analysis, etc., to one or more of the data storage module 214 for storage, the web server module 312 for transmission over the Internet, the human interface module 322 for review and manipulation by the user, and the data command and communication module 326 for transmission over the network 210.

In an embodiment, the data analysis module 314 receives an indication from the data validation and reduction module 312 when the voltage phase and the current phase from the ADC module 208 exhibits more than approximately 90 degrees and less than approximately 270 degrees of phase differential. The data analysis module 314 automatically identifies the correct phase that is associated with the ADC module 208 and attaches this phase information to the corresponding energy information from the associated ADC module 208 in the data validation and reduction module 312. The data analysis module 314 corrects the phase selection settings for the ADC module 208 in energy calculation module 308 so that the ADC module 208 is referenced to the correct phase from the phase ADC module 306.

Further, the data analysis module 314 processes validated and reduced energy data, sensor data, and external environmental and facility use information to derive and deliver electric load, device, and building management system/energy management system (BMS/EMS) control signals that are used to reduce or increase the electric energy in one or more specific circuits 218, 220, 222.

For example, the data analysis module 314 compares the measured fluid flow rate or gas pressure to the energy used by the motor 222, the temperature of the motor 222, the belt tension of motor 222, the rotational speed of motor 222, and the vibration of the motor 222. Efficiency factors and curves are then derived from a comparison and analysis of these measured operating parameters and design operational parameters. Motor specifications are obtained from vendor data or BIM data through the data command and communication module 108, the web server module 320 or the data storage module 214. The efficiency factors are used to automatically adjust the AC motor speed through a variable speed or vector drive motor controller to derive and optimize energy use for a required fluid flow rate or compressed gas rate. The measured data and efficiency factors are also used to alert a $3^{rd}$ party through the data command and communication module 108 of any motor malfunction or maintenance requirement. In the case of a DC motor 222, the PWM controller 324 is used to control the voltage to the motor/pump/compressor 222.

In another example, the data analysis module 314 compares the data from the sensor 334 and other sensor 226 and analytically derives the air flow of the motor 220. Other sensor 226 may measure upstream pressure, downstream pressure, motor parameters such as speed and temperature. The data analysis module 314 further compares the derived air flow to the motor efficiency and related motor/fan operating parameters. This data is then used to automatically adjust the AC motor speed and optimize its energy use through a variable speed or vector drive motor controller to deliver optimum energy use for a required air flow rate. In the case of a DC motor/fan 220, the PWM controller 324 is used to control the voltage to the motor/fan 220 for optimized operation.

At least some of the external environmental information is provided by the temperature sensor 224 which couples to the system bus 336 through the temperature compensation device 300, by one or more $3^{rd}$ party which couples to the system bus 336 through the data command and communication module 326, and by the other sensors 226 which couple to the system bus 336 through the other sensor compensation device 302. The temperature compensation device 300 receives the temperature measurements from the temperature sensor 224 and scales the temperature measurements so that the temperature data is compatible with the input requirements of the processor 202 and memory 204. In the embodiment illustrated in FIG. 3, the temperature sensors 224 are remotely located from the energy management system 102. In other embodiments, the temperature sensors 224 are located on the energy management system 102. The temperature measurements provide weather or time of day related temperature information of the areas surrounding the facility 104, temperature information of locations internal to the facility 104, device temperature information of the device associated with the circuit 218, 220, 222, and the like. In an embodiment, the temperature compensation 300 comprises calibration compensation look up tables to correctly utilize J or K thermocouple devices or wired/wireless thermostats for external local or remote measurement of temperature.

Likewise, the other sensor compensation device 302 receives the sensor measurements from the other sensors 226 and scales the sensor measurements so that the sensor data is compatible with the input requirements of the processor 202 and memory or modules 204. In the embodiment illustrated in FIG. 3, the other sensors 226 are remotely located from the energy management system 102. In other embodiments, the other sensors 224 are located on the energy management system 102. The other sensors, can be, by way of example and not limited to pressure sensors, light sensors, acceleration sensors, tension meters, flow sensors, gas sensors, microphones, humidity sensors, occupancy sensors, motion sensors, vibration sensors, wind speed, heat sensors, gas spectrometers, laser sensors, humidity sensors, and other environmental sensors such as water flow, air flow, and gas flow, and the like. The sensor data is analyzed to calculate energy loads, determine possible energy reduction, identify malfunctioning systems, and the like.

Based on analyzing and comparing at least the validated and reduced energy data, input from the sensors 224, 226, 332, 334, and input from $3^{rd}$ party module 108, the data analysis module 314 provides control signals for load control. In an embodiment, the energy management system 102 comprises the analog input/output ports 206 and/or the digital input/output ports 206, and the control signals are delivered to external devices through the ports 206 for load control of the external devices. In another embodiment, the control signals are delivered to the circuits 218, 220, 222 through the PWM controller module 324. In another embodiment, the control signals are delivered to $3^{rd}$ party through the data command and communication module 326.

In an embodiment, the energy management system 102 couples to the electrical circuits 218, 220, 222 through external high speed electronic switches such as high power MOSFETs, IGFETs, or the like. The PWM controller module 324 outputs a variable duty cycle pulsed signal for load control to the external high speed electronic switches. Such variable width pulses enable the external high speed electronic switch to control the electric energy and carbon footprint of any electric circuit 218, 220, 222 by switching the power to the electric circuit ON and OFF at high frequencies and for varying amount of time. The switching frequency varies from several times a minute to several KHz. The variable duty cycle pulsed signal in combination with the external high speed electronic switch is associated with a Class D or Class E control system design.

The data analysis module 314 sends the validated and reduced energy data and the analyzed energy data to the data command and communication module 326. The data command and communication module 326 interfaces the energy management system 102 to third parties 108 through the communication network 210. The data command and communication module 326 pushes data and pulls data, where a data push is a request for the transmission of information initiated by the energy management system 102 (the sender) or an automatic transmission, and a data pull is a request for the transmission of information initiated by the third party 108 (the receiver).

The data command and communication module 326 can push the validated and reduced energy data and/or the analyzed energy data using protocols to a remote device for real time or near real time analysis, to a remote device for control of the remote device, to a remote structured query language (SQL), SAP, or cloud database for storage, or the like. Further, the pushed data can be used for comparison of data, data mining, and additional data analysis. The additional data analysis includes but is not limited to billing, control of circuits, control of smart appliances, control of electric vehicle energy use, control of electric transportation systems energy use, and the like.

Examples of the protocols and communication systems are, but not limited to, Ethernet® such as IEEE standard 802.3, ZigBee®, Power Line Carrier (PLC), WiFi™ such as the IEEE family of standards 802.11, WiMax™ such as IEEE standard 802.16e-2005, and GSM. The data can be delivered in, for example, XML, JSON, CSV, ASCII strings, binary strings, and other formats. In an embodiment, the data command and communication module 326 uses data clock synchronization and system clocking via an Ethernet® connection. Other system connections include networked TCP/IP, client-server ModBus®, BACnet®, mesh network ZigBee® wireless, WiFi™, WiMax™ that are operating either individually or concurrently to interact with third party hardware and software.

The data command and communication module 326 further can store one or more of a copy of the measured data, the calculated data, the validated and reduced energy data, the analyzed energy data, and the sensor data in the data storage module 214 so that it can be viewed and accessed through the web server 320 or data command and communication module 326, according to certain embodiments. The data storage module 214 can store data in any of the data storage formats: binary, comma separated values, text file, XML files, relational database or non-relational database.

In one embodiment, the data command and communication module 326 can be configured to act as a slave to an acquisition host of the third party 108, such as a PC or the like, and can be configured to communicate with a master host of the third party 108 in one of several standard protocols, such as Ethernet®, ModBus®, BACnet®, for example. The data command and communication module 326 then acts as a translation of the protocol to serial communication.

In another embodiment, the energy management system 102 comprises a software digital I/O module and an analog I/O module, which interface with the data command and communication module 326 and with the data analysis module 314 to enable two-way software commands and interrupts between the data analysis module 314 and Building Management Systems (BMS), Building Energy Management Systems (BEMS), electrical vehicle charge stations, motor control systems, electrical control systems, smart appliances, programmable logic controllers, energy management reporting systems, carbon footprint reporting systems, other energy management system 102, and the like. In another embodiment, the I/O modules interface with pulse counters from natural gas or water meters to integrate this additional data.

The data command and communication module 326 implements predetermined and automated power reduction steps in energy use systems, smart appliances, or plug loads, based at least in part on at least one of the measured energy data, the calculated energy data, the reduced and validated energy data, the analyzed energy data, the sensor data, data from another energy management system 102, or on external demand response commands, according to certain embodiments.

The data storage module 214 stores energy data, such as the measured energy data, the calculated energy data, the reduced and validated energy data, the analyzed energy data, the sensor data, and any other data received or created by the energy management system 102. In an embodiment, the data storage module 214 provides a data buffer in case the communication channel with a local or remote host is broken. The buffer 214 decouples data sampling rates and data reporting rates. The energy data is stored locally at the required sampling rate until the communication lines are re-established. The energy data is then transferred to the host ensuring no data loss from a communication breakdown.

In an embodiment, the energy management system 102 records measurements from sensors 330, 332, 226, 224 at sampling frequencies larger than approximately 20 KHz. The measurements are validated in the data validation and reduction module 312 and analyzed in the data analysis module 314. The data command and communication module 326 automatically transfers the data to the third party 108 or the data storage module 214 at a reporting rate of approximately once every 1 minute. The sampling rate and the reporting rate are decoupled.

In another embodiment, the energy management system 102 records measurements from sensors 330, 332, 226, 224 at a sampling frequency of approximately 20 KHz. The measurements are validated in the data validation and reduction module 312 and analyzed in the data analysis module 314. The data command and communication module 326 automatically transfers the data to the third party 108 or the data storage module 214 at a reporting rate of approximately once every 1 minute. The measured data is compared to maximum and minimum thresholds at the sampling frequency of approximately 20 KHz. The data that crosses a threshold is automatically transferred to the third party 108 or the data storage module 214 at the time the threshold is crossed, independent of the reporting rate. The reporting of measured data at the rate of approximately once every minute continues unabated.

In an embodiment, the data encryption module 316 encrypts the energy data derived from measuring the electric circuits 218, 220, 222 using secure and anti-hacking data encryption algorithms. In another embodiment, the data encryption module 316 uses anti-tamper and anti-hacking handshaking from existing and emerging "smart grid" and or IT security data protocols.

In an embodiment, each energy management system 102 further comprises a unique address. In an embodiment, the address is a MAC address. In another embodiment, the address is a Globally Unique Identifier (GUID). In another embodiment, the unique identifier is a combination of an address and GPS information. The GPS module 318 maps the location of each addressed energy management system 102 and sends the GPS location coordinates to the data and command communication module 326 where the location coordinates are associated with the energy measurement data from the addressed energy management system 102. In an embodiment, the data encryption module 316 encrypts the energy data and the location information.

The human machine interface module (HMI) 322 provides an interactive user interface between the interface equipment 216 and the energy management system 102 over the communication bus 210. The web server module 320 further interfaces with the HMI module 322 and/or the interface equipment 216 to further provide the user with a Web-based user interface. In other embodiments, the energy management system 102 further comprises a user interface software module that is compatible with the ISO/IEEE 802/3 standard (Ethernet®) from personal computers (PCs) on local area or wide area networks.

The interface equipment 216 comprises, by way of example, a personal computer, a display, a keyboard, a QWERTY keyboard, 8, 16, or more segment LEDs or LCD panels, a display, a smartphone, a mobile communication device, a microphone, a keypad, a speaker, a pointing device, user interface control elements, tablet PCs, combinations of the same, and any other devices or systems that allow a user to provide input commands and receive outputs from the energy management system 102.

In one embodiment, the user, through the user interface, can define the grouping of sensors 330, 332, 334, 226, 224 to be measured and analyzed, define the locations for the sensors 306, 304, 332, 226, 224 to be measured and analyzed. Analysis performed on information from individual sensors 330, 332, 334, 224, 226 can also be performed on any grouping of these sensors in quasi real time or near real time. Groups may also include information from sensors attached to other energy management system 102. In an embodiment, the groupings and locations of the circuits 218 can be implemented using "drag and drop" techniques. Grouping and location information can be stored locally in data storage 214 and or in a remote data base. In addition, the "drag and drop" techniques can be used for charting and reporting. In another embodiment, the energy management system 102 further comprises a mobile device module to interface the energy management system 102 with a mobile device. Users can view real time or stored and "pushed" or "pulled" energy use on mobile platforms, such as for example, iPhone®, Android™, BlackBerry®, and the like.

Through the user interface, the user can define minimum and maximum alert thresholds on measured and calculated energy metrics, such as, for example, voltage, current, energies, energy consumption rate, powers, power factor, cost, cost rate, energy efficiency metric, energy efficiency rating, and the like, for each sensor 330, 332, 334, 224, 226, group of sensors 330, 332, 334, 224, 226 and locations.

Comparative alert thresholds are set for alerts triggered by relative energy signatures and/or readings between sensors 330, 332, 334, 224, 226, groups of sensors 330, 332, 334, 224, 226, and locations with each other, with established baselines, or with established benchmarks. Predictive alert thresholds are set for alerts triggered by the projected energy consumption and values of energy sensors 330, 332, 334, 224, 226, groups of sensors 330, 332, 334, 224, 226, or location. When an alert, as defined by the user, is triggered, the energy management system 102 provides the user with an alert through email, text message, Facebook®, Twitter®, voicemail, RSS feeds, multi-media message automatic alerts, and the like. In one embodiment, the alert is accompanied by a description of the trigger event including charts and reports on the energy history before the alert trigger, the projected consumption, the results of the trigger event, and the like.

In another embodiment, through the web server module or the push capability, the energy management system 102 provides the user with animated and interactive desktop and mobile widgets for communicating energy consumption levels, energy ratings and critical energy conservation measures to end users. In another embodiment, the energy management system 102 communicates energy consumption levels, energy ratings, energy efficiency metrics, and critical energy conservation measures to end users through RSS feeds with desktop tickers.

In other embodiments, the energy management system 102 determines and reports the need for equipment or system maintenance, such as, for example, air filter replacement, fluid filter replacement, belt tensioning, belt alignment, worn or damaged belt, worn or damaged bearings, worn or damaged gears, poor lubrication, damaged anchor or frame, damaged or worn brushes, unbalanced voltage, poor power quality, distorted waveform, high harmonic distortion, poor power factor, phase load imbalance, critical power capacity, defective sensor, duct leak, pipe leak, worn insulation, defective power capacitors, defective battery, defective power filter, defective uninterruptable power supply (UPS), defective voltage regulator, defective circuit breaker, defective economizer vanes, defective air valves, defective gas valves, defective water valves, defective meters, defective indicators, and the like, based on an electrical signature from the measured, calculated and analyzed electrical parameters, inputs from other sensors 226, 224, data from the $3^{rd}$ party 108, and stored data from data storage 214. In an embodiment, the electrical signature comprises at least one of a current and/or voltage waveform, current and/or voltage levels and peaks, power factor, other sensor information, such as temperature, vibration, acceleration, rotation, speed, and the like, of any "downstream" motor or pump.

Figure 6:
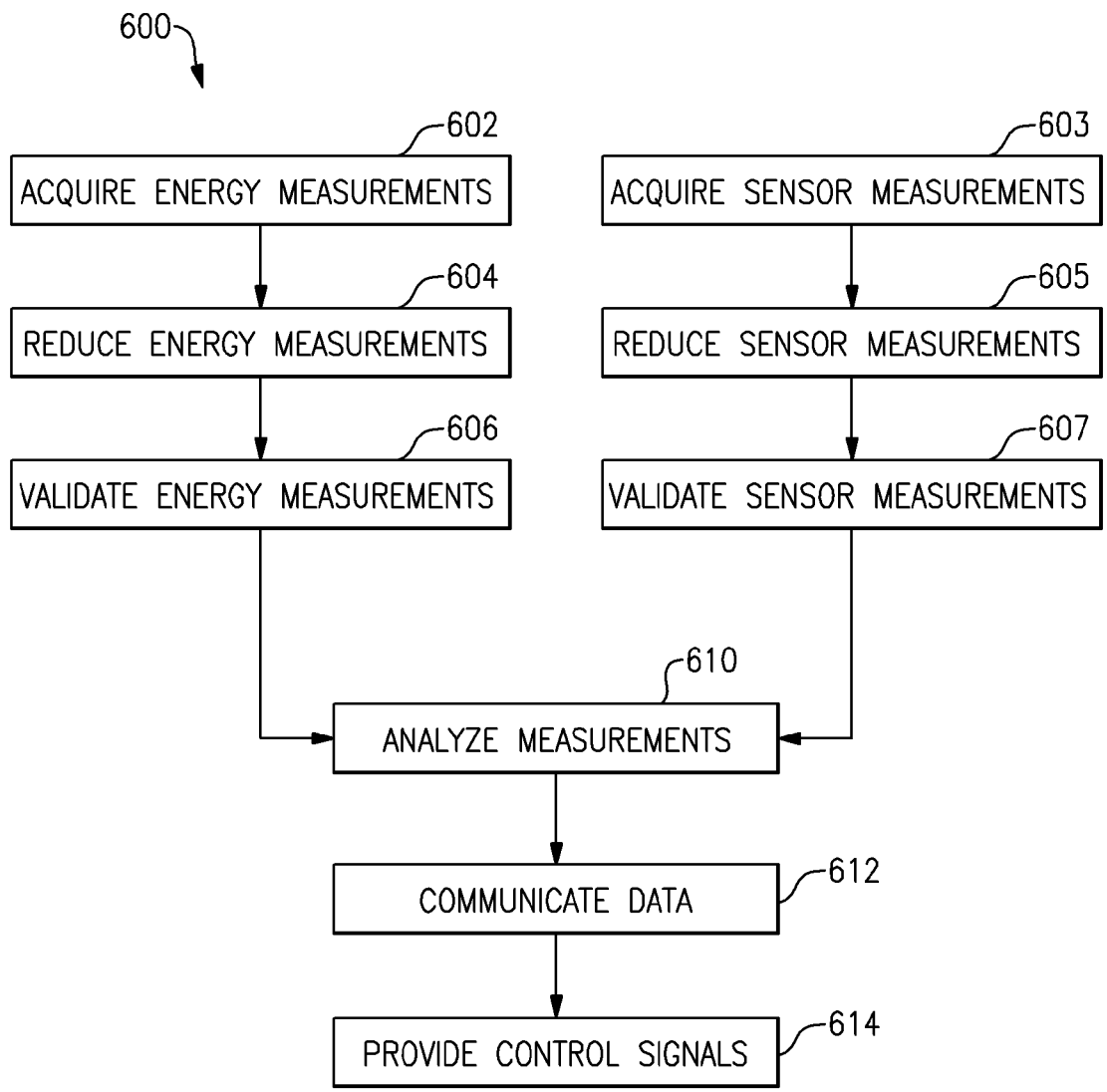
FIG. 6 is a flow chart of an exemplary energy data management process, according to certain embodiments.

FIG. 6 is a flow chart of an exemplary energy data management process 600. Beginning at blocks 602 and 603, the process 600 acquires energy measurements and sensor measurements respectively. In an embodiment, the measurements are acquired at a rate of up to approximately 24 KHz.

In some embodiments, the bandwidth of the communications between the energy management system 102 and third parties, over for example, a LAN, an internet, the Internet, or the like, may be insufficient to accommodate data at up to 24,000 samples per second for 1 to n circuits 218, 220, 222 and 1 to n sensors 226 and 224. To accommodate a smaller bandwidth, the process 600 at blocks 604 and 605 reduces the quantity of measurements stored and/or transmitted by not saving a measurement that is approximately the same as the prior measurement for each sensor 330, 332, 334, 224, 226 as described in FIG. 5 above. In an embodiment, the user determines how much the next measurement and the previous measurement differ before the measurements are not approximately the same.

At blocks 606 and 607, the process 600 validates the reduced measurements. When the next measurement differs significantly from the previous measurement, the process 600 acquires additional measurements of the parameter and compares the amplitudes of the additional measurements with the amplitude of the significantly different measurement, as described in FIG. 5 above. When the amplitudes are not proportional, the differing measurement is considered to have been caused by noise and it is not saved or transmitted. Conversely, when the amplitudes are proportional, the differing measurement is considered to be a valid measurement, indicative of an energy usage event, and it is stored and/or transmitted.

At block 610, the process 600 analyzes the acquired measurements, the reduced measurements, and the validated measurements to provide calculated energy measurements, energy efficiency metrics, energy ratings, cost information, carbon footprint, maintenance list, control signals, reports, recommendations, and the like. In an embodiment, the analysis is based at least in part on the sensor data.

At block 612, the process 600 communicates all or part of the energy data, the reduced and validated energy data, and/or the calculated energy data to third parties or to data storage 214. In an embodiment, the process automatically transmits or pushes the energy data directly to the third party, over a local area network, over a wide area network, over a smart grid, over an internet, over the Internet, or the like. The transmitted energy data comprises control signals, reports, recommendations, or the like. In an embodiment, the process 600 automatically transmits information related to at least one measured parameter at a rate of at least one per hour, more preferably at a rate of at least once per 15 minutes, and most preferably at a rate of at least once per minute. In another embodiment, the rate of automatically transmitting energy information may change based at least in part of the variability of the measured parameter. In another embodiment, the data is analyzed and transmitted at regular or user defined intervals, in addition to when the data crosses a user defined threshold. In another embodiment, the data from different sensors 330, 332, 334, 224, 226 is sampled and analyzed at different intervals. In another embodiment, the data from different sensors 330, 332, 334, 224, 226 is reported at different intervals.

At block 614, in an embodiment, the process 600 transmits control signal to at least one of the measured circuits 218, 220, 222, to another energy management system 102, or to a $3^{rd}$ party 108. In an embodiment, the control signals are pulse width modulation (PWM) signals to control the loading on the measured circuit 218, 220, 222. In an embodiment, the PWM signals are based at least in part on the sensor data. In an embodiment, the PWM signals are based at least in part on the measured energy data. In an embodiment, the PWM signals are based at least in part on data from the $3^{rd}$ party 108. In another embodiment, the PWM signals are based at least in part on the calculated energy data.

In an embodiment, the energy management system 102 can be used to measure energy usage and energy efficiency parameters related to the energy performance of electric motors. The acquire energy measurements block 602 may include, for example, power, current, voltage, power quality, harmonic energy, fundamental energy, energy in each harmonic frequency, voltage sags, voltage spikes, current drops, current spikes, and the like. The acquire sensor data block 603 may include, for example, motor vibration, motor speed, belt tension, motor temperature, motor imbalance, motor torque, parameters upstream motor, parameters downstream motor, and the like. The third party 108 and the data storage 214 may include, for example, facility demand reduction requirements, utility demand reduction requirements, weather conditions, building occupancy information, motor specifications from vendor, building information modeling (BIM) data on building systems, and the like. The communicate data block 612 may automatically transfer demand reduction potential, motor efficiency metrics, motor maintenance requirements, and motor maintenance alerts, motor activity log, motor event log, projected motor energy usage, and the like. The provide control signals block 614 includes, for example, pulse width modulation control of motor power, motor speed control, motor frequency control, turning motor ON, turning motor OFF, command sequences to other energy management systems 102, command sequences to third parties 108, and the like.

Additional Embodiments of the Energy Management System

In another embodiment, the energy management system 102 can be used to monitor at substantially continuous sampling rates the power quality of systems and report only power distortions independent of the reporting rate of the energy parameters. The ADC module 208 measures current and voltage at sampling rates exceeding approximately 20 kHz and compares the measured waveform of every circuit 218 and voltage from the phase ADC modules 306 to an acceptable waveform. The energy contained at each harmonic frequency is compared to an acceptable level of energy at each harmonic frequency in modules 212. The total harmonic energy, total fundamental energy, and the ratio of harmonic to fundamental energies are compared to acceptable levels in modules 212. The measured waveforms that are not acceptable waveforms, distorted waveforms, or in other words, fall out of specification, may be stored in the data storage module 214 and/or communicated via the data command and communication module 326. Alerts can be sent when a waveform is out of specification through the data command and communication module 326 within a user-defined period of time from when the distorted waveform was detected. In an embodiment, algorithms can be in place to avoid sending repeated alerts when sequential waveforms are distorted or when distorted waveforms are detected within a specified period of time. The ADC module 208 and the phase ADC module 306 can be used to detect high frequency spikes and drops in the measured parameters. Information on detected spikes can be stored in the data storage module 214 or transferred through the data command and communication module 326 at rates independent of the sampling rate or the reporting rate. A log of power quality, a count of acceptable waveforms, a count of non-acceptable waveforms, non-acceptable waveforms, spikes in measured data, drops in measured data, and the like, can be kept in the data storage module 214 and/or transferred through the data command and communication module 326.

Embodiments of the system relate to a method of measuring and analyzing energy usage. The method comprises measuring one or more parameters indicative of energy usage for a plurality of sub-circuits, wherein a sampling rate for measuring is substantially continuous, automatically transmitting information related to at least one of the measured parameters at a reporting rate decoupled from the sampling rate that enables monitoring of current energy usage, detecting a significant change in a measured parameter, determining whether the significant change in the measured parameter is caused by a change in energy usage, and automatically transmitting, independent of the sampling rate and the reporting rate, information related to the significant change in the measured parameter caused by the change in energy usage after detecting the significant change.

In an embodiment, automatically transmitting information related to the significant change in the measured parameter caused by the change in energy usage after detecting the significant change can occur within 30 seconds after the detected change occurs. The sampling rate can be between approximately 0.1 Hz and approximately 1 MHz, and the sampling rate is decoupled from the reporting rate that enables monitoring of the current energy usage. The reporting rate can be between approximately once per day and approximately eight thousand times per second. The sampling rate and the reporting rate may vary from one measured parameter to another. The detected significant change can be approximately a 0.25% change in the measured parameter or the detected significant change can be user-defined. The rate of automatically transmitting information may change based on the variability of the measured parameter. The measured parameter can be selected from the group consisting of light intensity, rotational speed, linear speed, temperature, vibration, carbon dioxide, pressure, motion, flow, acceleration, position, tension, torque, voltage, current, sound, and ultrasonic frequencies. The measured current can be referenced to any of the measured voltage phases for determination of power factor and phase angle. The measured circuits can be of Delta configuration, Wye configuration, or any combination thereof and in any sequence. The voltage measurements can be of one or more phases, and the voltage measurement of any phase can be referenced to the voltage measurement of any other phase including one or more neutrals.

In an embodiment, the method further comprises outputting, based at least in part on the measured parameter, a variable duty cycle signal for load control of at least one electric circuit, wherein the load control includes at least one of electric energy control and carbon footprint control, and wherein the electric circuit is selected from the group consisting of a lighting circuit, a motor circuit, an air handling system, a pump, and an HVAC compressor system. The measured parameter can be stored when it cannot be automatically transmitted and a stored parameter can be transmitted automatically when possible.

Further. in an embodiment, determining whether the significant change in the measured parameter is caused by the change in energy usage includes acquiring an additional sample of the measured parameter, and determining whether the additional sample of the measured parameter is proportional to the significant change of the measured parameter, wherein when the additional sample of the measured parameter is proportional to the significant change in the measured parameter, the significant change in the measured parameter is caused by the change in energy usage. The additional sample can be acquired within 10 msec of detecting the significant change in the measured parameter. The method further comprises storing the significant change in the measured parameter when the significant change in the measured parameter is caused by the change in energy usage and disregarding the significant change in the measured parameter when the additional sample of the measured parameter is not proportional to the significant change in the measured parameter.

According to a number of embodiments, the disclosure relates to a system for measuring and analyzing energy efficiency of a facility or facility subsystem. The system comprises a plurality of energy measurement devices configured to measure one or more parameters indicative of energy usage for a plurality of circuits, sub-circuits, or systems wherein a sampling rate for measuring is substantially continuous, a plurality of measurement devices configured to measure one or more parameters indicative of the energy efficiency of systems, wherein a sampling rate for measuring is substantially continuous, a plurality of measurement devices configured to measure one or more parameters indicative of the environmental condition of systems and facilities, wherein a sampling rate for measuring is substantially continuous, computer hardware including at least one computer processor, and computer-readable storage including computer-readable instructions that, when executed by the computer processor, cause the computer hardware to perform operations defined by the computer-executable instructions. The computer-executable instructions include automatically transmitting information related to at least one of the measured parameters at a rate that enables monitoring of current energy efficiency, automatically obtaining relevant environmental conditions including weather data, detecting a significant change in a measured parameter, determining whether the significant change in the measured parameter is caused by a change in energy efficiency, determining whether and the significant change in the measured parameter caused a change in energy efficiency, and automatically transmitting information related to the significant change in the measured parameter caused by the change in energy efficiency after detecting the significant change.

In an embodiment, automatically transmitting information related to the significant change in the measured parameter caused by the change in energy efficiency after detecting the significant change can occur within 30 seconds after the detected change occurs. The sampling rate can be between approximately 0.1 Hz and approximately 1 MHz, and the sampling rate is independent of the rate that enables monitoring of the current energy usage. The detected significant change can be approximately a 0.25% change in the measured parameter or the detected significant change can be user defined. The rate of automatically transmitting information may change based on the variability of the measured parameter. The measured parameter can be selected from the group consisting of light intensity, rotational speed, linear speed, temperature, vibration, carbon dioxide, pressure, motion, flow, acceleration, voltage, current, sound, and ultrasonic frequencies.

The computer-executable instructions further include, in an embodiment, outputting, based at least in part on the measured parameter, a variable duty cycle signal for load control of at least one electric circuit, where the load control includes at least one of electric energy control and carbon footprint control, and wherein the electric circuit is selected from the group consisting of a lighting circuit, a motor circuit, an air handling system, and an HVAC compressor system. The computer-executable instructions further include providing derived analysis of energy required by a facility or facility subsystem, based in part on the measured parameter that is selected from the group of measured parameters consisting of building orientation, time of day, outside air temperature, inside air temperature, reheat coil water temperature, cold air temperature, CO2, and enthalpy of return air. The computer-executable instructions further include a providing a derived analysis of energy required by a facility or a facility subsystem, based in part on a group of derived factors that are selected from those factors that contribute to facility heat loading and energy use including consisting of building occupancy, time of day, day of the week, day of the year, vacation schedules, lighting heat loads, and number of PC computers that are present in the facility. The computer-executable instructions further include outputting data, based at least in part on a comparison of the measured parameter of energy use compared to the derived parameter of energy required for a facility or facility subsystem consisting, of at least one of an electric circuit, and a gas circuit, outside temperature, and inside temperature, and time of day and facility occupancy, and wherein the measured electric circuit, gas circuit, CO2, return air enthalpy is selected from the group consisting a lighting circuit, a motor circuit, an air handling system, an HVAC reheat hot water coil system, and a HVAC compressor system. The computer-executable instructions further include outputting of data, based at least in part on a comparison of the measured parameter of energy used and compared to the derived parameter of energy required by a facility or subsystem from the group consisting of a lighting circuit, a motor circuit, an air handling system, and a HVAC compressor system. The computer-executable instructions further include outputting data, based at least in part on a comparison of the measured parameter of energy use compared to the derived parameter of energy required for a facility or subsystem where the difference of measured energy used versus derived energy required by a facility or subsystem provides a differential signal that is proportional to the difference in measured energy used parameter versus derived energy parameter required from the group consisting of a lighting circuit, a motor circuit, an air handling system, a boiler reheat coil system, and a HVAC compressor system. The computer-executable instructions further include outputting substantially instantaneous demand response energy load use data that is based at least in part on a comparison of the measured parameter of energy use compared to the derived parameter of energy required for a facility subsystem from the group consisting of a lighting circuit, a motor circuit, an air handling system, and an HVAC compressor system.

Further, in an embodiment, determining whether the significant change in the measure parameter is caused by the change in energy usage or energy required by a building or a building subsystem includes acquiring an additional sample of the measured parameter, and determining whether the additional sample of the measured parameter is proportional to the significant change of the measured parameter, wherein when the additional sample of the measured parameter is proportional to the significant change in the measured parameter, the significant change in the measured parameter is caused by the change in energy efficiency. The additional sample can be acquired within 10 msec of detecting the significant change in the measured parameter. The computer-executable instructions further include storing the significant change in the measured parameter when the significant change in the measured parameter is caused by the change in energy usage or a change in energy required. The computer-executable instructions further include disregarding the significant change in the measured parameter when the additional sample of the measured parameter is not proportional to the significant change in the measured parameter.

Certain other embodiments relate to a system for measuring, analyzing and controlling energy usage of a facility or facility subsystem. The system comprises a plurality of energy measurement devices configured to measure one or more parameters indicative of energy usage for a plurality of circuits, sub-circuits, or systems where a sampling rate for measuring is substantially continuous, a plurality of measurement devices configured to measure one or more parameters indicative of the energy efficiency of systems, where a sampling rate for measuring is substantially continuous, and a plurality of measurement devices configured to measure one or more parameters indicative of the environmental condition of systems and facilities, wherein a sampling rate for measuring is substantially continuous. The system further comprises computer hardware including at least one computer processor, and computer-readable storage including computer-readable instructions that, when executed by the computer processor, cause the computer hardware to perform operations defined by the computer-executable instructions. The computer-executable instructions include automatically transmitting information related to at least one of the measured parameters at a rate that enables monitoring of current energy efficiency, automatically obtaining relevant environmental conditions including weather data, automatically determining control sequence to maximize energy efficiency, automatically determining control sequence to minimize demand usage at any time without affecting operations and comfort, automatically transmitting control commands to at least one system or equipment, detecting a significant change in a measured parameter, determining whether the significant change in the measured parameter is caused by a change in energy usage, determining whether and the significant change in the measured parameter caused a change in energy efficiency, and automatically transmitting information related to the significant change in the measured parameter caused by the change in energy efficiency after detecting the significant change.

In an embodiment, the computer-executable instructions further include outputting, based at least in part on the measured parameter, a variable duty cycle signal for load control of at least one electric circuit, wherein the load control includes at least one of electric energy control and carbon footprint control, and where the electric circuit is selected from the group consisting of lighting circuit, a motor circuit, an air handling system, and an HVAC compressor system. The computer-executable instructions further include outputting demand response energy load use data that is based at least in part on a comparison of the measured parameter of energy use compared to the derived parameter of energy required for a facility subsystem for purposes of providing an output signal that enables reduction in energy used in one or more building subsystems consisting of a lighting circuit, a motor circuit, an air handling system, an HVAC reheat coil system, and an HVAC compressor system.

In an embodiment, the measured parameter includes at least one of motor speed, motor temperature, motor vibration, belt tension, motor balance, motor torque, motor power consumption, motor phase imbalance, motor power factor, motor power quality, motor harmonic energy, motor fundamental energy, facility demand reduction requirements, utility demand reduction requirements, and parameters upstream and downstream of a motor. In an embodiment, analyzed data includes at least one of motor efficiency and motor maintenance requirements. In another embodiment, the control command includes at least one of turning the motor on, turning the motor off, reducing motor speed, reducing motor frequency, and pulse width modulation of motor power.

Additional Configurations of Embodiments of the Energy Management System

In one arrangement, electrical power from the power distribution grid enters the facility 104 through a main power bus into the facility's power distribution system. The power distribution system typically comprises a power distribution panel including main power distribution bars, electrical circuits 218, 220, 222, and circuit breakers. Examples of a power distribution panel are a main switch board, a sub panel, a distribution panel/box, a motor control center (MCC), and the like. In an embodiment, the energy management system 102 is enclosed in an enclosure mounted adjacent to the facility's power distribution panel and electrically connected to the panel's electrical circuits 218, 220, 222 through circuit breakers. In other embodiments, the energy management system 102 is embedded in the facility's power distribution system.

In another embodiment, the energy management system 102 is embedded in a circuit breaker have an integral measuring device 330, such as a current sensor, a current transformer, a shunt resistor module, or the like, and a wireless, wired or power line carrier (PLC) communication and command module.

In other embodiments, the energy management system 102 is enclosed in an enclosure mounted in the space to be monitored. In further embodiments, the energy management system 102 can be embedded in motors 220, 222, appliances, pumps 220, fans 222, lighting fixtures, elevators, elevator motors, electrical equipment, variable frequency devices, variable air volume valves, thermostats, temperature sensors, computers, machinery, electric vehicles, power supplies, generator controllers, or other electrical equipment and appliances, such as power outlets, power sockets, power strips, power extensions, power adapters, light switches, motion sensors, gas sensors, security cameras, IR detectors, load sensors, and the like.

Additional Features of Embodiments of the Energy Management System

The energy management system 102 can further comprises one or more of circuit protection, a circuit breaking capability, a power factor correction capability, and a frequency shifting and switching capability, such as currently employed by variable frequency drives, Class D or Class E control circuits, and the like, using high speed electronic switching devices, such as TRIAC switches, MOSFET switches, solid state relays or any other high speed high power switching devices, for example.

In other embodiments, the energy management system 102 further comprises one or more of a wireless or wired communication module, occupancy sensor, occupancy counter, light sensor, temperature sensor, wireless thermostat, current sensor, gas sensor, heat sensor, rechargeable battery backup, solar photovoltaic panel for self powered systems, LED displays, and the like.

Other embodiments of the energy management system 102 communicate with other devices and/or instruments in the vicinity, such as, for example, controlling/non-controlling and wired/wireless thermostats, variable air volume (VAV) controllers, mechanical or electrical shades, automatic door locks, door sensors, card scanners, RFID devices, generator controller, and the like.

Other embodiments of the energy management system 102 can be part of a mesh network in peer-to-peer, client-server, or master-slave configuration and yet further embodiments can be a Plug & Play, install and forget, stand alone measurement, communication, and control system.

Additional embodiments of the energy management system 102 can measure and analyze data from internal and external sensors including current, voltage levels and waveforms, temperature, vibration, motor speed, motor torque and mechanical load, and the like. Other embodiments can calculate and communicate in real time or near real time an efficiency rating of a motor 220, 222 or other electrical equipment that may take into consideration an ambient condition of the motor 220, 222 or other electrical equipment in addition to the measured and analyzed data. The ambient condition can be communicated to the device through the embedded communication module, the analog inputs 206, or the digital inputs 206.

The embodiments of the method, technology, circuits, and algorithms can be implemented, for example, on a circuit board with discrete components such as integrated circuits (ICs), application specific ICS (ASICs), field-programmable gate arrays (FPGAs), gate arrays, and modules, or can be built into an ASIC, central processing unit (CPU) 202, or system on a chip (SoC) for purposes of local or remote digital measurement, analysis, communication, and control of electric energy that is used by electrical systems, motors, buildings, appliances, electric vehicles, and/or electric transportation systems that are temporarily or permanently connected to an electric grid, the envisioned "smart grid", or at a point on a micro-grid, or in a residence, building, data center, or commercial facility that uses electricity and that appears at any point along an electric grid, micro grid, "smart grid", or at any point in a power distribution system, including but not limited to transformers, capacitors, and distribution panels.

Depending on the embodiment, certain acts, events, or functions of any of the algorithms described herein can be performed in a different sequence, can be added, merged, or left out all together (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an ASIC, a FPGA or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in the energy management system 102. In the alternative, the processor and the storage medium can reside as discrete components in the energy management system 102.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
   a first input configured to receive first facility data, wherein the first facility data is associated with a facility and has a first protocol;
   first circuitry configured to sample the first facility data at a first sampling rate to generate first digital facility data, wherein the first sampling rate is substantially continuous;
   a second input configured to receive second facility data, wherein the second facility data is associated with the facility and has a second protocol different from the first protocol;
   second circuitry configured to sample the second facility data at a second sampling rate to generate second digital facility data, wherein the second sampling rate is substantially continuous; and
   a communication port comprising an analog I/O module configured to transmit reporting digital data over a network, the communication port further comprising a software digital I/O module configured to transmit the reporting digital data over the network using a network protocol different from the first protocol and the second protocol, wherein the reporting digital data is based, at least in part, on at least one of the first digital facility data and the second digital facility data, and wherein the reporting digital data is transmitted at a reporting rate that is decoupled from the first sampling rate and the second sampling rate.

2. The apparatus of claim 1 wherein the communication port is further configured to receive information comprising at least one of control signals, control schedules, and control policies.

3. The apparatus of claim 1 further comprising memory configured to store at least one of the first digital facility data, the second digital facility data, and the reporting digital data.

4. The apparatus of claim 1 wherein the network comprises the Internet, and wherein the network is accessed by one or more of wired access and wireless access.

5. a1) The apparatus of claim 4 wherein the network comprises one or more servers in a cloud configuration.

6. The apparatus of claim 1 wherein memory stores the reporting digital data until confirmation that the reporting digital data has been successfully transmitted over the network.

7. The apparatus of claim 1 wherein the reporting rate is substantially continuous.

8. The apparatus of claim 1 further comprising analytics configured to provide an analysis based at least in part on the first facility data and the second facility data.

9. The apparatus of claim 8 wherein the analysis comprises one or more of an energy analysis, an efficiency analysis, a usage analysis, an occupancy analysis, and a performance analysis.

10. A method to aggregate, filter, and share data for analysis, the method comprising:
 receiving first facility data, wherein the first facility data is associated with a facility and has a first protocol;
 sampling the first facility data at a first sampling rate to generate first digital facility data, wherein the first sampling rate is substantially continuous;
 receiving second facility data, wherein the second facility data is associated with the facility and has a second protocol different from the first protocol;
 sampling the second facility data at a second sampling rate to generate second digital facility data, wherein the second sampling rate is substantially continuous; and
 transmitting reporting digital data over a network at a reporting rate that is decoupled from the first sampling rate and the second sampling rate, wherein the network has a network protocol different from the first protocol and the second protocol, wherein the reporting digital data is based, at least in part, on at least one of the first digital facility data and the second digital facility data, and further wherein the reporting digital data is transmitted using a software input/output (I/O) module and an analog I/O module.

11. The method of claim 10 further comprising receiving information comprising at least one of control signals, control schedules, and control policies.

12. The method of claim 10 further comprising storing at least one of the first digital facility data, the second digital facility data, and the reporting digital data.

13. The method of claim 10 wherein the network communicates with the Internet, and wherein the network is accessed by one or more of wired access and wireless access.

14. The method of claim 13 wherein the network comprises one or more servers in a cloud configuration.

15. The method of claim 10 further comprising storing the reporting digital data until confirmation that the reporting digital data has been successfully transmitted over the network.

16. The method of claim 10 wherein the reporting rate is substantially continuous.

17. The method of claim 10 further comprising comparing a value of a present data sample with a value of a prior data sample, and based at least in part on the comparison, determining if the present data sample is a valid data sample.

18. The method of claim 10 further comprising providing an analysis based at least in part on the first facility data and the second facility data.

\* \* \* \* \*

UNITED STATES PATENT AND TRADEMARK OFFICE
CERTIFICATE OF CORRECTION

| | | |
|---|---|---|
| PATENT NO. | : 9,052,216 B2 | Page 1 of 1 |
| APPLICATION NO. | : 14/306886 | |
| DATED | : June 9, 2015 | |
| INVENTOR(S) | : Kamel et al. | |

It is certified that error appears in the above-identified patent and that said Letters Patent is hereby corrected as shown below:

In the specification

Column 3 line 41, Change "embodiments" to --embodiments.--.

Column 17 line 39, Change "and or" to --and/or--.

Column 18 line 19, Change "and or" to --and/or--.

Column 22 line 7, Change "Further." to --Further,--.

In the claims

Column 29 line 7, Claim 5, before "The" delete "al)".

Signed and Sealed this
Twenty-third Day of February, 2016

Michelle K. Lee
*Director of the United States Patent and Trademark Office*